United States Patent
Takamizawa

(10) Patent No.: US 6,940,900 B2
(45) Date of Patent: Sep. 6, 2005

(54) DATA COMPRESSION, CONTROL PROGRAM FOR CONTROLLING THE DATA COMPRESSION

(75) Inventor: Yuichiro Takamizawa, Tokyo (JP)

(73) Assignee: NEC Corporation, Tokyo (JP)

( * ) Notice: Subject to any disclaimer, the term of this patent is extended or adjusted under 35 U.S.C. 154(b) by 749 days.

(21) Appl. No.: 10/033,088

(22) Filed: Dec. 27, 2001

(65) Prior Publication Data

US 2002/0080872 A1 Jun. 27, 2002

(30) Foreign Application Priority Data

Dec. 27, 2000 (JP) ........................................ 2000-396450

(51) Int. Cl.$^7$ ............................. H04B 1/66; H04N 1/41
(52) U.S. Cl. ...................... 375/240; 358/1.15; 382/239; 704/201; 704/500
(58) Field of Search ....................... 358/1.15; 375/240; 382/239; 704/201, 500

(56) References Cited

U.S. PATENT DOCUMENTS

| | | | |
|---|---|---|---|
| 5,463,699 A | 10/1995 | Wilkinson | |
| 5,613,091 A | 3/1997 | Stone et al. | |
| 5,825,830 A | 10/1998 | Kopf | |
| 6,484,142 B1 * | 11/2002 | Miyasaka et al. | 704/500 |

FOREIGN PATENT DOCUMENTS

| | | | | |
|---|---|---|---|---|
| EP | 1 047 198 A2 | 10/2000 | | |
| EP | 1047198 A2 * | 10/2000 | ............ | H03M/7/42 |
| GB | 2 321 5 77 | 7/1998 | | |
| GB | 2321577 A * | 7/1998 | ............ | H04B/1/66 |
| JP | 6-311369 | 11/1994 | | |
| JP | 7-274171 | 10/1995 | | |
| JP | 10-105372 | 4/1998 | | |
| WO | WO 93/10624 | 5/1993 | | |

OTHER PUBLICATIONS

Bosi, M., et al., "ISO/IEC MPEG–2 Advanced Audio Coding", Journal of the Audio Engineering Society, Audio Engineering Society, New York, vol. 45, No. 10, Oct. 1, 1997, pp. 789–812.

* cited by examiner

*Primary Examiner*—Stephen Chin
*Assistant Examiner*—Erin M. File
(74) *Attorney, Agent, or Firm*—Scully, Scott, Murphy & Presser

(57) ABSTRACT

In a data compression device having a plurality of Huffman coders given identification (ID) values, respectively, to produce Huffman codes together with the corresponding ID codes obtained from the ID values, a re-coding portion is included to change a sequence of the ID values so that a reduction is accomplished about a code amount of the Huffman codes and the ID codes obtained from the ID value sequence and is operable to re-code an input data sequence again by Huffman coders indicated by the changed ID values. Such re-coded Huffman codes and ID codes based on the changed ID values are produced as output data signals.

28 Claims, 8 Drawing Sheets

DATA COMPRESSION, CONTROL PROGRAM FOR CONTROLLING THE DATA COMPRESSION

BACKGROUND OF THE INVENTION

This invention relates to data compression, a control program for controlling the data compression, and a computer-readable storage medium for storing the control program. In particular, this invention relates to a data compression device and method for use in the data compression.

A conventional data compression device of the type described has been exemplified in Japanese Unexamined Patent Publication No. Hei 6-311369 (namely, 311369/1994) that will be simply called Reference 1. The data compression device described in Reference 1 is used for an image coding device that is given a sequence of quantized image signals as input data signals and that carries out data compression processing.

More specifically, the data compression device has first through third Huffman coders that carry out data compression by the use of different Huffman coding tables and that are previously given identification codes. One of the first through the third Huffman coders that produces or outputs a minimum code amount of Huffman codes is selected as a selected coder by a code selector. The Huffman codes compressed by the selected coder are produced together with the corresponding identification code assigned to the selected coder. In other words, combinations of the Huffman codes and the corresponding identification codes are successively produced from the data compression device disclosed in Reference 1.

When data compression processing is repeated many times in a manner as mentioned before, a code amount of identification codes is excessively increased, which brings about deterioration of coding efficiency.

In order to reduce a code amount of the identification codes, using a run length code has been recommended so as to generate the Identification codes in MPEG-2 AAC which is prescribed in connection with an audio signal by the International standard organization. As regards the MPEG-2 AAC standard, detailed description is made in Information Technology-Generic coding of moving pictures and associated audio, Part 7: (Advanced Coding AAC).

Now, description will be made about a method of generating the identification codes in accordance with MPEG-2AAC. In the MPEG-2AAC, each of the Huffman coders, such as each of the first through the third Huffman coders mentioned above, can be distinguished from one another so as to identify the selected coder by using numerals from one to fifteen as the identification codes. In other words, each Huffman coder is identified by each of the numerals. Each numeral that specifies the corresponding Huffman coder is generated in the form of an identification value. Such an identification value is successively generated each time when the selected coder is determined.

Specifically, it is assumed that the first through the third Huffman coders are given the numerals "0", "1", and "2", as the identification values, respectively. In this event, when the first, the second, and the third Huffman coders are successively selected as the selected coder in order, the identification values "0", "1", and "2" are successively produced from the code selector. Practically, a plurality of the identification values are combined or collected together and subjected to run length coding to be coded into the identification codes.

For example, it is surmised that the identification values are represented by a series of "0,0,0,2,2,1,1,1,1" that is divided into a string of "0", a string of "2", and a string of "1". More specifically, the string of "0" lasts for three times (will be called "3" run) while the strings of. "2" and "1" last for two times ("2" run) and four times ("4" run), respectively. Since each identification value and its concatenation is encoded by the run length coding, the above-mentioned identification values are encoded into the identification code of "0,3, 2, 2, 1, 4".

In the above-mentioned MPEG-2AAC, the identification value and the run of each identification code are represented by four bits and five bits, respectively. According to the MPEG-2AAC, the series of "0,0,0,2,2,1,1,1,1" is encoded into "0,3,2,2,1,4" that can be represented by:

(4 (bits)+5 (bits))×3=27 (bits).

On the other hand, when each identification value of the above-mentioned series of "0,0,0,2,2,1,1,1,1" is encoded by four bits, 36 bits (=4×9) are required to encode the whole of the series.

From this fact, it is readily understood that a code amount can be reduced by carrying out encoding operation in accordance with the MPEG-2AAC.

However, such a reduction of a code amount can be accomplished only when the same numerals or identification values are continued a lot. For example, let a series of the identification values be "0,1,0,2,1,2,0,1,2". In this case, when each identification value is encoded by four bits, the whole of the series can be encoded by 36 bits (=4 (bits)×9). On the other hand, the run length coding needs 81 bits (=(4 bits+5 bits)×9).

This means that the above-mentioned method is bad in compression ratio and large in code amount because the identification code is not efficiently coded which identifies the selected Huffman coder.

SUMMARY OF THE INVENTION

It is an object of this invention to provide a data compression device and method both of which are high in compression ratio of data with a code amount reduced.

It is another object of this invention to provide a control program which can be used in the data compression device and method mentioned above.

It is still another object of this invention to provide a recording medium which stores the control program.

According to a first aspect of this invention, a data compression device comprises a plurality of coding means for successively coding a sequence of data signals by using a plurality of coding units that are given identification values, respectively, and that are different in structure from one another to produce a plurality of codes in response to each input data signal, selecting means for selecting a shortest one of the codes to produce a sequence of the shortest codes and the corresponding identification codes obtained by coding a sequence of the identification values assigned to the coding units of producing the shortest codes, and re-coding means for re-coding the input data sequence into re-coded codes, by changing the identification values into changed Identification values so as to reduce a total code amount of identification codes obtained by the changed identification values and the re-coded codes coded in accordance with the changed identification values and to produce the re-coded codes and the changed identification codes as a compressed output data sequence.

According to a second aspect of this invention, the re-coding means changes the sequence of the identification values to the changed identification values, so as to decrease the code amount of the identification codes.

According to a third aspect of this invention, the sequence of the identification values is subjected to run length coding to obtain the, identification codes.

According to a fourth aspect of this invention, the re-coding means comprises calculating means for calculating a first total code amount of the re-coded codes and the corresponding changed identification codes and a second total code amount of the shortest codes and the corresponding identification codes and comparing means for comparing the first total code amount with the second total code amount to produce the re-coded codes and the changed identification codes as the compressed output data sequence when the first total code amount is smaller than the second total code amount.

According to a fifth aspect of this invention, the re-coding means comprises changing means for further changing the sequence of the identification values so that the changed identification codes have a smaller amount to repeatedly operate the comparing means.

According to a sixth aspect of this invention, run length coding is carried out so that each run of the identification values becomes long and thereby a code amount of the identification values is controlled.

According to a seventh aspect of this invention, the re-coding means comprises means for changing the sequence of the identification values divided into a plurality of runs, into the changed identification values by lengthening each run of the identification values and a plurality of coding means for coding the input data signals in accordance with the changed identification values.

According to an eighth aspect of this invention, the plurality of the coding means are selected by each of the changed identification values.

According to a ninth aspect of this invention, the plurality of the coding means are Huffman coders that have different coding tables.

According to a tenth aspect of this invention, the re-coding means comprises a plurality of additional Huffman coders that have different coding tables and that are made to correspond to the Huffman coders, respectively.

According to an eleventh aspect of this invention, a data compression method comprising the steps of coding a sequence of input data signals into a plurality of code sequences obtained by the use of different coding methods given identification values, respectively, selecting a shortest one of the code sequences together with a selected sequence of the identification values concerned with each code of the shortest code sequence, coding the selected identification value sequence into a sequence of identification codes, changing the selected identification value sequence into a changed sequence of identification values, and re-coding the input data signals by the use of the changed sequence of the identification values to obtain re-coded codes and the corresponding changed identification codes and to produce the re-coded codes and the corresponding changed identification codes as a data compressed output signal sequence.

According to a twelfth aspect of this invention, the changing step is executed so that a code amount of identification codes obtained by the changed sequence of the identification values becomes small in comparison with a code amount of the selected identification value sequence.

According to a thirteenth aspect of this invention, the re-coding step comprises the steps of calculating a first total code amount of the re-coded codes and the corresponding changed identification codes and a second total code amount of the shortest codes and the corresponding identification codes and comparing the first total code amount with the second total code amount to produce the re-coded codes and the changed identification codes as the compressed output data sequence when the first total code amount is smaller than the second total code amount.

According to a fourteenth aspect of this invention, the re-coding step comprises the step of further changing the sequence of the identification values so that the changed identification codes have a smaller amount to repeatedly operate the comparing step.

According to a fifteenth aspect of this invention, the run length coding is carried out so that each run of the identification values becomes long and thereby a code amount of the identification values is controlled.

According to a sixteenth aspect of this invention, a recording medium stores a control program and is readable by a computer. The control program comprises the steps of coding a sequence of input data signals into a plurality of code sequences obtained by the use of different coding methods given identification values, respectively, selecting a shortest one of the code sequences together with a selected sequence of the identification values concerned with each code of the shortest code sequence, coding the selected identification value sequence into a sequence of identification codes, changing the selected identification value sequence into a changed sequence of identification values, and re-coding the input data signals by the use of the changed sequence of the identification values to obtain re-coded codes of the input data signals and the corresponding changed identification codes and to produce the re-coded codes and the corresponding changed identification codes as a data compressed output signal sequence.

According to a seventeenth aspect of this invention, the changing step is executed so that a code amount of identification codes obtained by the changed sequence of the identification values becomes small in comparison with a code amount of the selected identification value sequence.

According to an eighteenth aspect of this invention, the re-coding step comprises the steps of calculating a first total code amount of the re-coded codes and the corresponding changed identification codes and a second total code amount of the shortest codes and the corresponding identification codes and comparing the first total code amount with the second total code amount to produce the re-coded codes and the changed identification codes as the compressed output data sequence when the first total code amount is smaller than the second total code amount.

According to a nineteenth aspect of this invention, the re-coding step comprises the step of further changing the sequence of the identification values so that the changed identification codes have a smaller amount to repeatedly operate the comparing means.

According to a twentieth aspect of this invention, run length coding is carried out to calculate each code amount of the changed identification codes so that each run of the identification values becomes long.

According to a twenty-first aspect of this invention, the identification values are changed to changed identification values so that each run of the identification values becomes long and the re-coding step is carried out by the use of the changed identification values.

According to a twenty-second aspect of this invention, a data compression device is operable in response to a sequence of input data signals to produce a sequence of output compressed data signals. The data compression device comprises a plurality of data coding means which are given identification values, respectively, and which carry out coding of the input data signals in different ways, respectively, for coding the input data signal sequence into a plurality of codes with the respective identification values attached, respectively, selecting means for selecting a minimum code amount of the codes as selected codes with selected identification values which are attached and which are coded into selected identification codes, changing means for changing the identification values into changed identification values which are coded into changed identification codes, re-coding means for re-coding the input data signals into a sequence of re-coded signals with reference to the changed identification values so as to compare a total code amount of the selected codes and the selected identification codes with a total code amount the re-coded codes and the changed identification codes. The selected identification codes are produced by run length coding a sequence of the identification values while the changing means changes the identification values into the changed identification values by lengthening each run of the identification value sequence so that each run becomes long. The re-coding means re-codes the input data signals in accordance with the changed identification codes.

According to a twenty-third aspect of this invention, each of the selected and the changed identification values is divided into a plurality of runs arranged from a leftmost run to a rightmost one. The changing means successively lengthens each run from the leftmost run to the rightmost run.

According to a twenty-fourth aspect of this invention, a data compression method is for executing data compression in response to a sequence of input data signals to produce a sequence of output compressed data signals. The data compression method comprises the steps of carrying out coding of the input data signals into a plurality of codes with respective identification codes attached by using a plurality of data coding means which are given the identification values, respectively, selecting a minimum code amount of the codes as selected codes with selected identification values which are attached and which are coded into selected identification codes, changing the identification values into changed identification values which are coded into changed identification codes, and re-coding the input data signals into a sequence of re-coded signals with reference to the changed identification values so as to compare a total code amount of the selected codes and the selected identification codes with a total code amount the re-coded codes and the changed identification codes. The selected identification codes are produced by run length coding a sequence of the identification values while the changing means changes the identification values Into the changed identification values by lengthening each run of the identification value sequence so that each run becomes long. The re-coding step re-coding the input data signals in accordance with the changed identification codes.

According to a twenty-fifth aspect of this invention, each of the selected and the changed identification values is divided into a plurality of runs arranged from a leftmost run to a rightmost one. The changing means successively lengthening each run from the leftmost run to the rightmost run.

According to a twenty-sixth aspect of this invention, a program is for use in carrying out data compression of a sequence of input data signals to produce a compressed output data sequence. The program comprises the steps of carrying out coding of the input data signals into a plurality of codes with respective identification codes attached by using a plurality of different data coding means which are given the identification values, respectively, selecting a minimum code amount of the codes as selected codes with selected identification values which are attached and which are coded into selected identification codes, changing the identification values into changed identification values which are coded into changed identification codes, and re-coding the input data signals into a sequence of re-coded signals with reference to the changed identification values so as to compare a total code amount of the selected codes and the selected identification codes with a total code amount the re-coded codes and the changed identification codes. The selected identification codes are produced by run length coding a sequence of the identification values while the changing means changes the identification values into the changed identification values by lengthening each run of the identification value sequence so that each run becomes long. The re-coding step re-codes the input data signals in accordance with the changed identification codes.

According to a twenty-seventh aspect of this invention, each of the selected and the changed identification values is divided into a plurality of runs arranged from a leftmost run to a rightmost one. The changing means successively lengthening each run from the leftmost run to the rightmost run.

According to a twenty-eighth aspect of this invention, the plurality of the different data coding means are Huffman coders which have coding tables different from one another.

DESCRIPTION OF THE PREFERRED EMBODIMENTS

Figure 1:
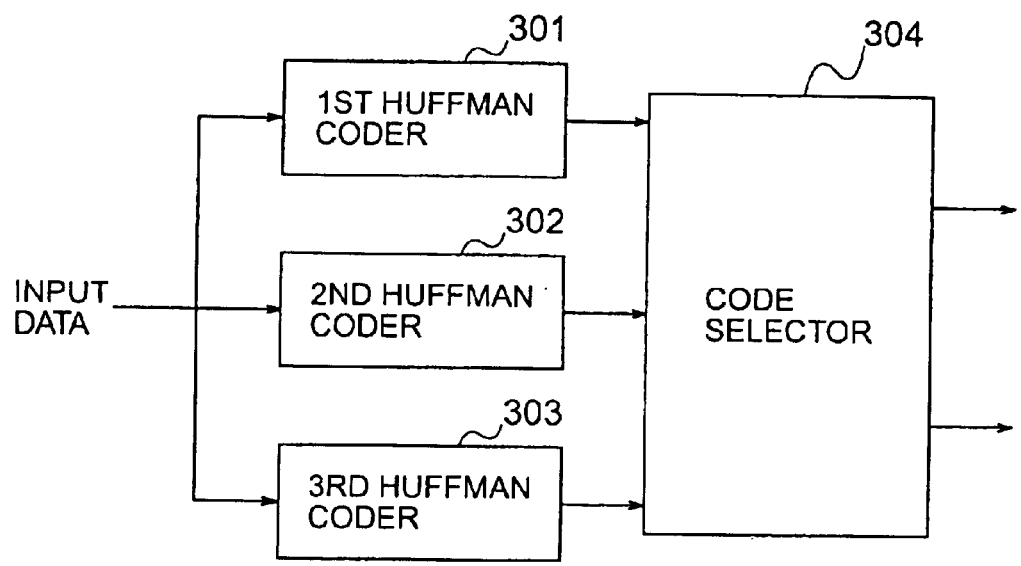
FIG. 1 shows a block diagram of a conventional data compression device.

Referring to FIG. 1, description will be made about a conventional data compression device that is substantially equivalent to that illustrated in Reference 1 cited in the preamble of the instant specification. The illustrated data compression device is given a sequence of input data signals which may be a sequence of quantized image signals, namely, a sequence of digital image signals. In this connection, the data compression device may be considered as being used in an image coding apparatus. As shown in FIG. 1, the data compression device has first, second, and third Huffman coders 301, 302, and 303 and a code selector 304.

Specifically, the first through the third Huffman coders 301 to 303 executes data compression of the input data sequence by the use of Huffman coding tables different from one another to supply the code selector 304 with first through third Huffman codes, respectively. Herein, it is to be noted that the first through the third Huffman coders 301 to 303 are previously given first through third identification values "0", "1", and "2" so as to identify the respective coders. The code selector 304 selects either one of the first through the third Huffman codes that has a minimum code amount and that may be a shortest code. Thus, the Huffman codes of the minimum code amount is selected by the code selector 304 as a selected code. Thus, the code selector 304 recognizes a selected Huffman coder and its identification code assigned to the selected Huffman coders and produces both the selected codes and their identification codes.

Figure 2:
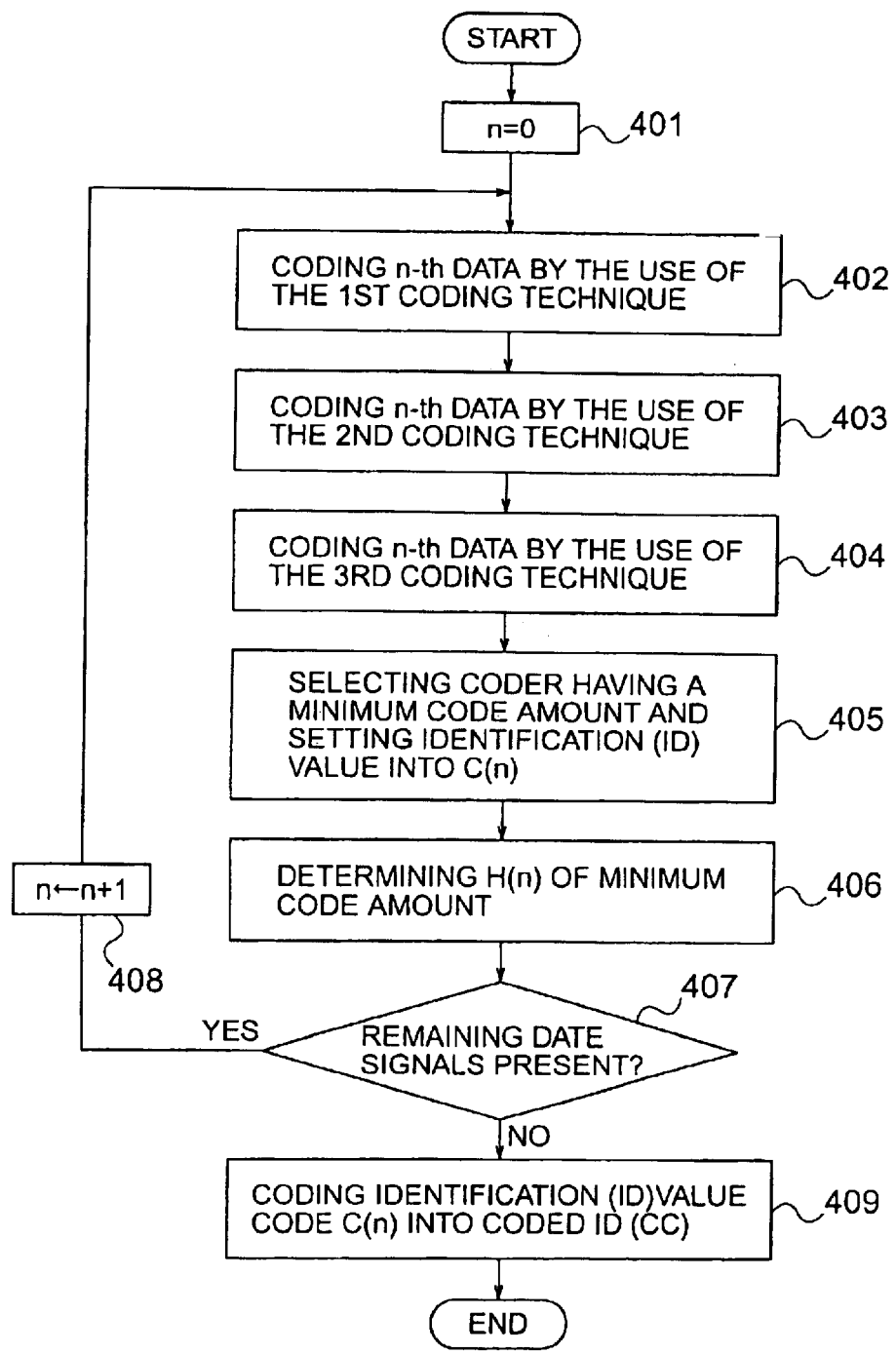
FIG. 2 shows a flow chart for use in describing operation of the data compression device illustrated in FIG. 1.

Referring to FIG. 2 together with FIG. 1, description will be made about operation of the data compression device shown in FIG. 1.

In FIG. 2, it is assumed that a plurality of input data signals are successively given to the data compression device in a series. As shown in FIG. 2, a variable n is used to successively designate each of the input data signals from a zeroth data signal and is, therefore, initially set into 0 at a step 401 after start of data compression. At steps 402, 403, and 404, an n-th data signal is delivered to the first through the third Huffman coders 301 to 303 (FIG. 1) to be coded by the use of the first through the third Huffman coding tables into first through third Huffman codes which correspond to the n-th data signal and which may be called first through third Huffman unit codes, respectively, for convenience of description. In other words, the first through the third Huffman coders 301 to 303 carry out coding operations in different coding manners or techniques to produce the first through the third Huffman unit codes. At a step 405, the code selector 304 selects either one of the first through the Huffman coders 301 to 303 that produces the minimum code amount (namely, the shortest code length) of the Huffman unit codes. As a result, the code selector 304 recognizes the identification (ID) value C(n) assigned to the selected Huffman coder to determine the identification value C(n) at the step 405. In addition, the selected Huffman unit code (designated by H(n)) that has the minimum code amount is determined by the code selector 304 at a step 406 to be produced as an output coded signal.

At a step 407, judgment is made about whether or not the remaining input data signals are present. If the remaining input data signals to be compressed are left (Step 407: Yes), processing proceeds to the step 408 so as to add unity (1) to the variable n and is thereafter returned back to the step 402. Otherwise, processing proceeds to a step 409 at which each identification (ID) value C(n) is encoded into an identification (ID) code CC. The ID code CC is produced from the data compression device.

The above-mentioned device and method have shortcomings as mentioned in the preamble of the instant specification.

Figure 3:
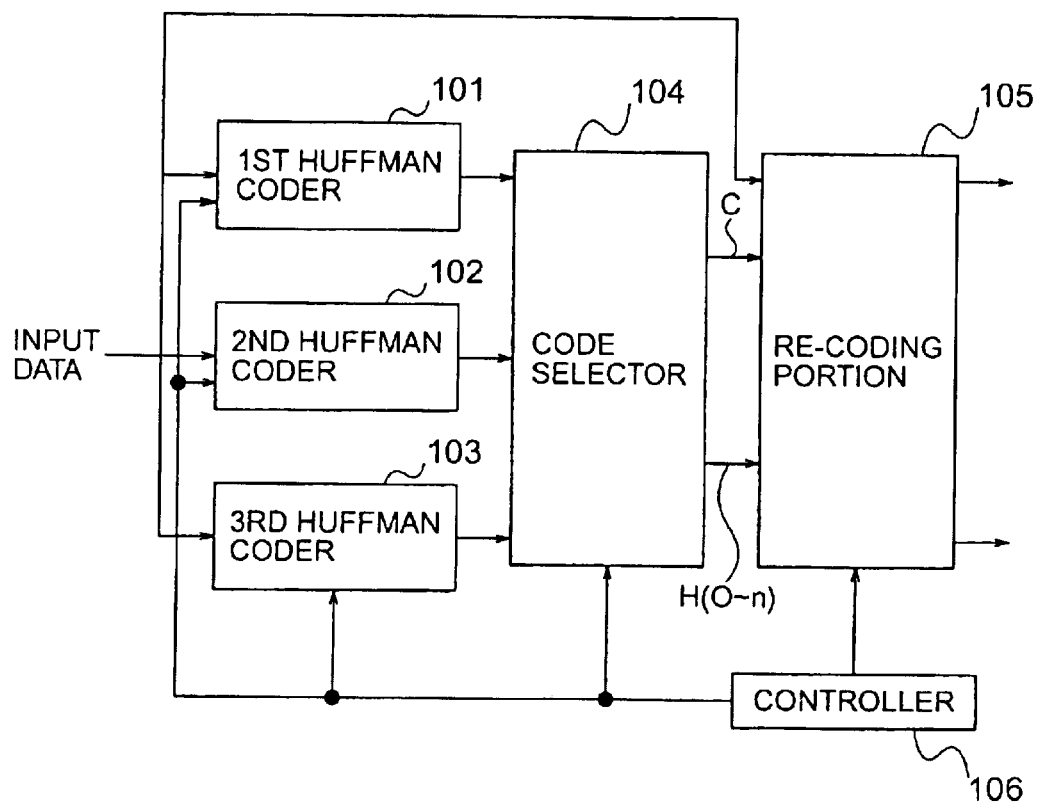
FIG. 3 shows a block diagram of a data compression device according to a first embodiment of this invention.

Referring to FIG. 3, a data compression device according to a first embodiment of this invention has first through third Huffman coders 101 to 103 similar to the first through the third Huffman coders 301 to 303 illustrated in FIG. 1, respectively, and a code selector 104 similar to the code selector 304 in FIG. 1. The first through the third Huffman coders 101 to 103 are previously given first through third identification values (such as "0", "1", "2"), as mentioned in conjunction with FIG. 1. Furthermore, the illustrated data compression device comprises a re-coding portion 105 and a controller 106 which is operable to control the above-mentioned units 101 to 105.

Specifically, the first through the third Huffman coders 101 to 103 carry out Huffman coding of the input data signals in accordance with different Huffman coding tables to produce first through third Huffman unit codes, respectively, in a manner similar to that illustrated in FIG. 1. Although the Huffman coders 101 to 103 are equal in number to three in FIG. 3, the number of the Huffman coders may not be restricted to three.

Like in FIG. 1, the first through the third Huffman unit codes are sent to the code selector depicted by 104. Supplied with the first through the third Huffman unit codes, the code selector 104 selects the Huffman unit code of a minimum code amount from the first through the third Huffman codes as the selected unit code.

In addition, the code selector 104 is also operable like the code selector 304 illustrated in FIG. 1 to carry out run length coding of the identification values into the identification (ID) code CC. This shows that the code selector 304 codes a sequence of the ID values (namely, a time history of the ID values) into the ID code.

The selected unit code sequence and the corresponding ID code CC are successively given to the re-coding portion 105. In the example illustrated, the selected unit code sequence itself is not given to the re-coding portion 105 and, instead, the input data signals to be compressed are given to the re-coding portion 105.

Figure 4:
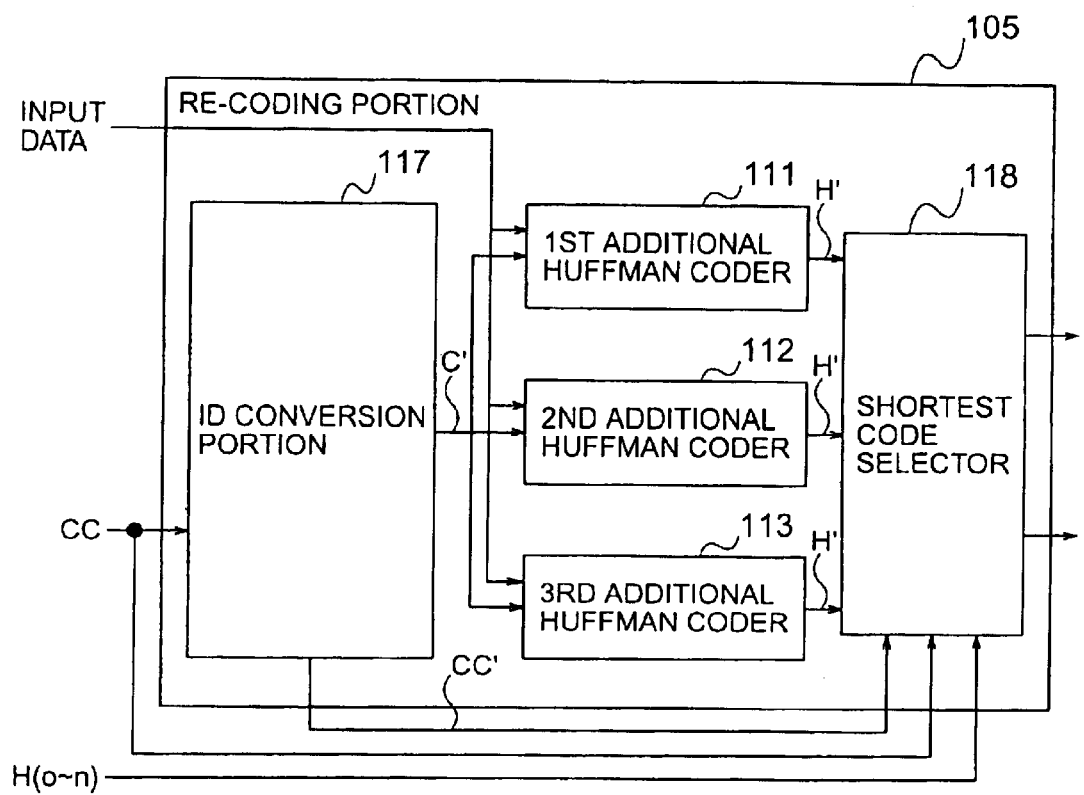
FIG. 4 shows a block diagram of a re-coding portion used in the data compression device illustrated in FIG. 3.

Referring to FIG. 4 along with FIG. 3, the re-coding portion 105 has first, second, and third additional Huffman coders 111, 112, and 113, which are similar in structure and operation to the first through the third Huffman coders 101 to 103 (FIG. 3), respectively. In this connection, the first through the third additional Huffman coders 111 to 113 have Huffman coding tables identical with those of the first through the third Huffman coders 101 to 103, respectively, and are assigned with the same identification values as those of the first through the third Huffman coders 101 to 103, respectively. Specifically, the identification values of the first through the third additional Huffman coders 111 to 113 may be, for example, "0", "1", and "2", respectively. In this connection, the first through the third additional Huffman coders 111 to 113 may be collectively called a re-coding unit and may be used by switching the first through the third Huffman coders 101 to 103 by a software program.

Herein, it is to be noted in FIG. 4 that the first through the third additional Huffman coders 111 to 113 are also supplied with the input data signals like 101 to 103 in FIG. 3.

In the example illustrated in FIG. 4, the re-coding portion 105 further has an ID conversion portion 117 supplied with the identification (ID) codes (CC) selected by the code selector 104 in a manner to be described later in detail. The ID conversion portion 117 is operable to convert the identification codes (CC) into a sequence of converted or changed ID codes so that a total code amount of the identification codes (CC) and the Huffman unit codes become small, as will be later described in detail.

Herein, it is assumed that the ID conversion portion 117 monitors only the identification codes (CC) so as to render the ID codes (CC) into a minimum code amount because the selected Huffman unit codes are not changed. In any event, the ID conversion portion 117 produces the converted or changed ID codes with a minimum code amount.

Thus, the converted ID codes and the input data signals are successively delivered to the first through the third additional Huffman coders 111 to 113. In this event, the converted ID codes and the input data signals are given in parallel to the first through the third additional Huffman coders 111 to 113.

As will become clear later as the description proceeds, the first through the third additional Huffman coders 111 to 113 are selected again by the shortest code selector 118 as a re-selected additional Huffman coder under control of the controller 106 illustrated in FIG. 3. As a result, the re-selected Huffman unit codes are produced together with the converted ID codes from the shortest code selector 118, as a compressed output data sequence.

Figure 5:
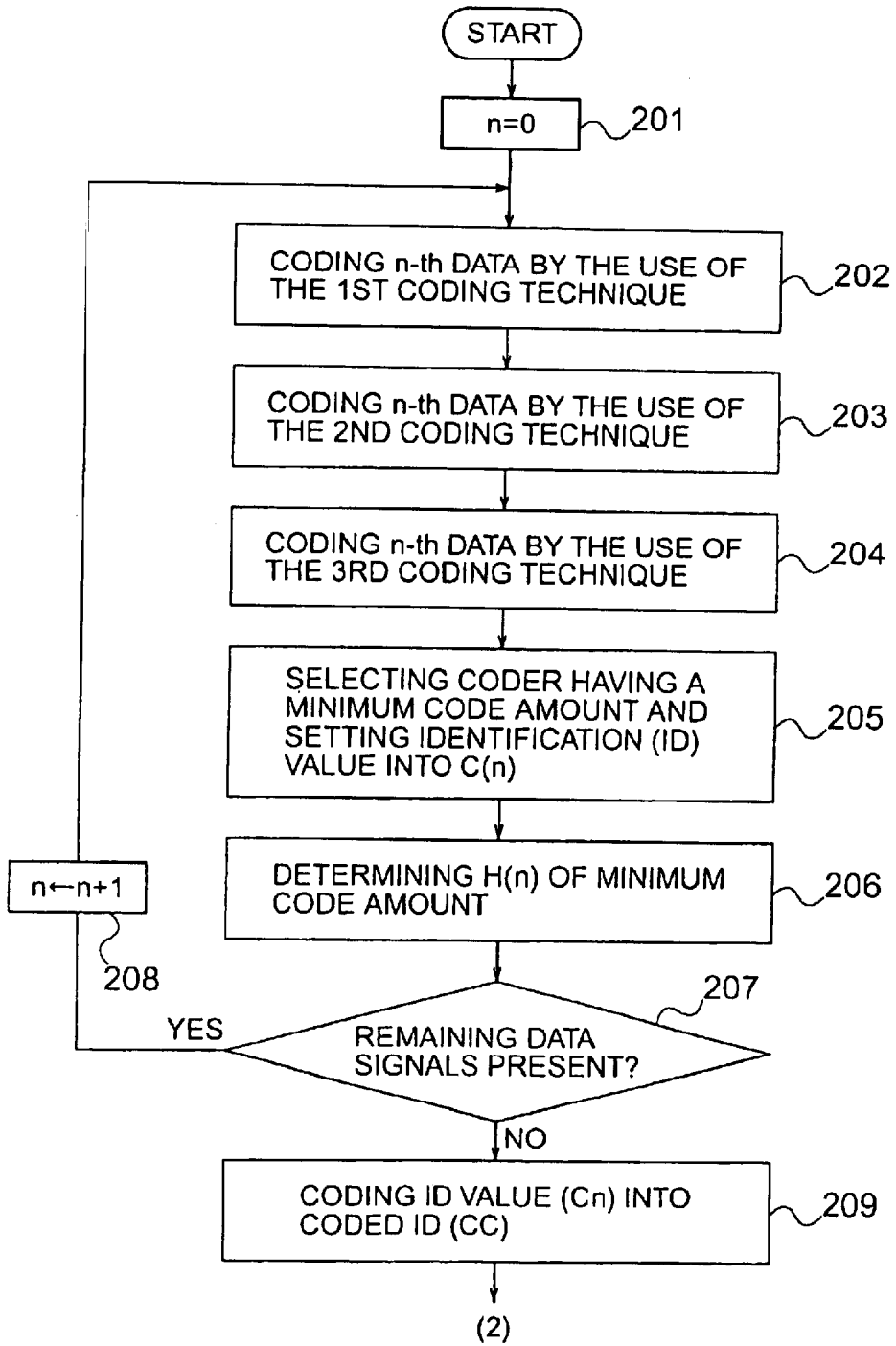
FIG. 5 shows a flow chart for use in describing operation of a part of the data compression device illustrated in FIG. 3.
Figure 6:
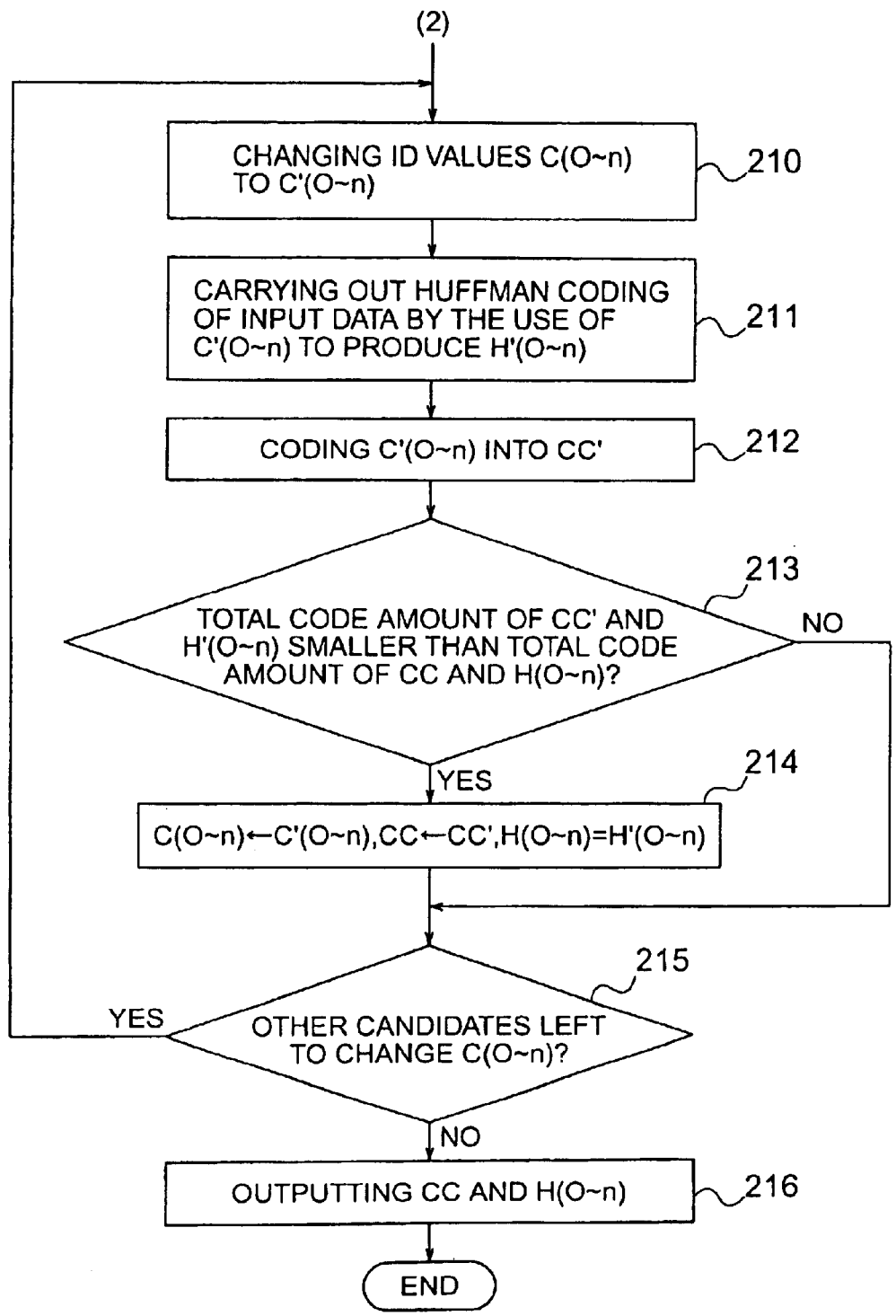
FIG. 6 shows a flow chart for use in describing operation of the re-coding portion illustrated in FIG. 4.

Referring to FIGS. 5 and 6, operation will be described about the code selector 104 and the re-coding portion 105 of the data compression device illustrated in FIGS. 3 and 4. As shown in FIG. 5, a variable n is set into zero at a step 201 after start of data compression, like at the step 401 illustrated in FIG. 2. Thereafter, an n-th data signal designated by the variable n is given to the first through the third Huffman coders 101 to 103 to be coded into first through third Huffman unit codes at steps 202, 203, and 204 similar to the steps 402, 403, and 404 in FIG. 2. The code selector 104 selects a minimum code amount (the shortest length code) of the first through the third Huffman unit codes as a selected Huffman coder and detects the identification (ID) value assigned to the each of the first through the third Huffman coders 101 to 103 that produces the minimum amount code. The detected ID value of the selected Huffman coder is produced as C(n) at a step 205 like in the step 405. If the first through the third Huffman coders are selected by the code selector 104, the ID values "0", "1", and "2" are produced as the detected ID value C(n).

At a step 206, the selected Huffman unit codes that have the minimum code amount are determined as H(n) and are not produced as an output signal from the data compression device in the illustrated example.

Subsequently, judgment is made at a step 207 about whether or not the remaining data signals to be compressed are left. If the remaining data signal are present (step 207: Yes), the step 207 is followed by a step 208 at which the variable n is counted up by one and thereafter, processing is returned back to the step 202. Otherwise, the detected ID values C(0–n) are coded into ID codes (CC) at a step 209, by using a run length coding technique.

Further referring to FIG. 6, description will be made about operation of the re-coding portion 105. In FIG. 6, the ID codes (CC) corresponding to the selected Huffman unit codes are given to the ID conversion portion 117 and at first reversed into the corresponding ID values in the ID conversion portion 117. At a step 210 in FIG. 6, the ID conversion portion 117 changes the reversed ID values C(0–n) into converted ID values depicted by C'(0–n) in a manner to be described later. Such a change of the ID values C(0–n) to C'(0–n) is executed so that a code amount of converted ID codes CC' obtained by the changed ID values C((0–n) becomes small in comparison with the ID codes CC given from the code selector 104. For example, when the run length coding technique is used to generate the ID codes, the ID values C(0–n) are changed so that a run length of the changed ID values C'(0–n) becomes as long as possible. In other words, such operation is executed so that the same ID values are continued as long as possible.

In consequence, the first through the third additional Huffman coders 111 to 113 illustrated in FIG. 4 are supplied with the input data signals and the changed or converted ID values C'(0–n). In this case, each of the input data signals is delivered to either one of the first through the third additional Huffman coders 111 to 113 that is indicated by each of the changed ID values C'(0–n). Under the circumstances, the first through the third additional Huffman coders 111 to 113 selectively carry out the Huffman coding of the respective input data signals in response to the changed ID values C'(0–n) again to produce re-coded or converted Huffman unit codes H'(0–n). From this fact, it is readily understood that the input data signals numbered 0 to n are converted into re-coded Huffman unit codes H'(0–n), respectively.

At a step 212, the changed ID values C'(0–n) are coded into ID codes CC' in a manner as mentioned in conjunction with the step 209. Namely, the run length coding technique may be used to code the changed ID values C'(0–n) into the changed ID codes CC'.

In the illustrated example, the shortest code selector 118 is given the Huffman unit codes H(0–n) and the ID codes CC from the code selector 104 in FIG. 3. Moreover, the changed ID codes CC' are also given from the ID conversion portion 117 to the shortest code selector 118. The illustrated shortest code selector 118 is also supplied with the re-coded Huffman unit codes H'(0–n) from the first through the third additional Huffman coders 111 to 113, as mentioned before.

In this situation, the shortest code selector 118 calculates a first total code amount of the change ID codes CC' and the re-coded Huffman unit codes H'(0–n) together with a second total code amount of the ID codes CC and the Huffman unit codes H(0–n). At a step 213, the first total code amount of CC' and H'(0–n) is compared with the second total code amount of CC and H(0–n) by the shortest code selector 118. This shows that judgment is made about whether or not a code amount is reduced by changing the ID values into the changed ID values at the step 210.

If the first total code amount is smaller than the second total code amount (step 213: Yes), the shortest code selector 118 selects the changed ID values C'(0–n), the changed ID codes CC', and the re-coded Huffman unit codes H'(0–n), as ID values C(0–n), ID codes CC', and the Huffman unit codes H(0–n), respectively, at a step 214. In other words, the changed ID values C'(0–n), the changed ID codes CC', and the re-coded Huffman unit codes H'(0–n) are copied into ID values C(0–n), ID codes CC', and the Huffman unit codes H(0–n), respectively. Otherwise (step 213: No), the step 213 proceeds to a step 215 without executing the step 214. In this case, non-changed ID values C(0–n), the non-changed ID codes CC, and non re-coded Huffman codes H(0–n) are produced as they stand.

At the step 215, it is judged whether or not any other candidates are left when the ID values C(0–n) are changed at the step 210. If any other changing candidates are left (step 215: Yes), processing is returned back from the step 215 to the step 210 and is repeated in the above-mentioned manner. If no candidate is left (step 215: No), the step 215 is succeeded by a step 216 at which CC and H(0–n) determined by the above-mentioned manner are produced as output compressed signals.

Thus, ID values are searched to establish a minimum code amount by repeatedly changing the ID values and by repeatedly executing Huffman coding.

Now, description will be made in detail about the steps 210 and 215 mentioned in FIG. 6. Herein, it is assumed that the data number of the input data signals is equal to 5 (namely, n=4) and the ID values C (0–4) obtained by the step 205 are represented by "0,1,0,1,1". In addition, the run length coding technique is assumed to be used at the steps 209 and 212 so as to generate the ID codes from the ID values. In this case, the code amount of the ID codes becomes equal to 36 bits when the step 209 is finished. Specifically, the ID values C (0–4) of "0,1,0,1,1" is represented by a single continuation or run of "0", a single run of "1", a single run of "0", and two runs of "1", and thus is specified by four runs. Therefore, the code amount of the above-ID codes becomes equal to 9 (bits)×4 (=36 bits).

At the step 210 illustrated in FIG. 6, the ID values C are changed or rearranged to the changed ID values C' so that the code amount is reduced by changing or rearranging. Herein, it is noted that a reduction of a code amount can be accomplished by lengthening each run when the run length coding Is used. This shows that the above-mentioned ID values C of "0,1,0,1,1" which can be divided into four runs can reduce the code amount of the ID codes by lengthening each run.

For example, in the ID values of "0,1,0,1,1", it is surmised that the leftmost run of "0" is lengthened to two runs of "0" and the resultant changed ID values are rendered into "0,0,0,1,1" that can be specified by two runs or runs. This changed ID values can be coded by 18 bits (=9 (bits)×2). Likewise, lengthening the second run of "1" leftwards gives the changed ID value C' of "1,1,0,1,1" while lengthening the second run of "1" rightwards results in the changed ID values C' of "0,1,1,1,1). Furthermore, lengthening the second run of "1" both leftwards and rightwards renders "0,1,0,1,1" into "1,1,1,1,1". Similarly, lengthening the third run of "0" leftwards results in "0,0,0,1,1" while lengthening the third run of "0" rightwards brings about "0,1,0,0,1". In addition, lengthening the third run of "0" leftwards and rightwards results in "0,0,0,0,1". In addition, lengthening the fourth run of "1" leftwards brings about "0,1,1,1,1".

The candidates of the ID values C are selected from each of the ID values lengthened leftwards, rightwards, or both leftwards and rightwards, as mentioned above. In general, a code amount of the Huffman codes increases as the ID values are changed from one to another. However, the above-mentioned method according to this invention can realize an improvement of a compression ratio in the whole of the data compression device or a data processing device when a code reduction effect of the ID codes CC exceeds a code increase of the Huffman codes, as mentioned above.

Taking the above into account, the step 215 illustrated in FIG. 6 may be returned back to the step 210 after judgment is made about whether or not the candidates of changing the runs are left. Such a change of runs may be executed by lengthening each run leftwards, rightwards, and both leftwards and rightwards. Practically, as an example of a method, consideration may be made which successively lengthens each run from a leftmost run to determine each run as a candidate and to determine, as a last candidate, a run obtained by lengthening a rightmost run. Furthermore, when the code reduction effect can be accomplished by the above-mentioned procedure, similar procedure may be repeated by further lengthening the leftmost lengthened run to determine it as a candidate and by repeating such a lengthening run procedure until the rightmost run. Such a procedure may be repeated until the code reduction effect can not be obtained or may be repeated predetermined times.

Turning back to FIG. 5, the steps 202, 203, 204, and 211 may not practically carry out the Huffman coding but may merely calculate a code amount of Huffman codes. With this method, it is possible to reduce an amount of calculation. In this event, the zeroth to n-th data signals are subjected to Huffman coding by the use of the ID values C(0–n) to produce the Huffman unit codes H(0–n).

In the description concerned with the steps 210 and 215 in FIG. 5, the changed candidates of the ID values C are determined by lengthening each run leftwards, rightwards, and both leftwards and rightwards. In other words, the changed ID values obtained by lengthening each run in three ways are all determined as the changed candidates. However, each run may be expanded or lengthened in either one or two of the above-mentioned three ways.

Taking the above into consideration, judgment may be made at the step 215 in FIG. 6 about whether or not each run is lengthened in all directions, such as the leftward direction, rightward direction, and both the leftward and rightward directions, to detect candidates. As a result, judgment may be made about whether or not any other candidates may be left and the step 15 may be returned back to the step 210 when the candidates still remain.

In the interim, it may be considered to determine, as candidates, all the changed ID values that can be obtained by lengthening all thinkable combinations of runs. However, this method needs a huge amount of calculations. In order to reduce an amount of calculations, a method may be considered wherein each run is successively lengthened from a leftmost run as a changed candidate to a rightmost run until a last changed candidate is determined by lengthening the rightmost run. To the contrary, another method may be considered wherein a changed candidate is successively determined from the rightmost run towards the leftmost one by lengthening each run from the rightmost run to the leftmost run and by determining the last candidate by lengthening the rightmost run.

In this event, each run may be again lengthened from either the rightmost run or the rightmost one in a reverse direction when the code reduction effect can be obtained in the above-mentioned procedure. Such a procedure may be repeated until no code reduction effect can be accomplished or repeated predetermined times.

Figure 7:
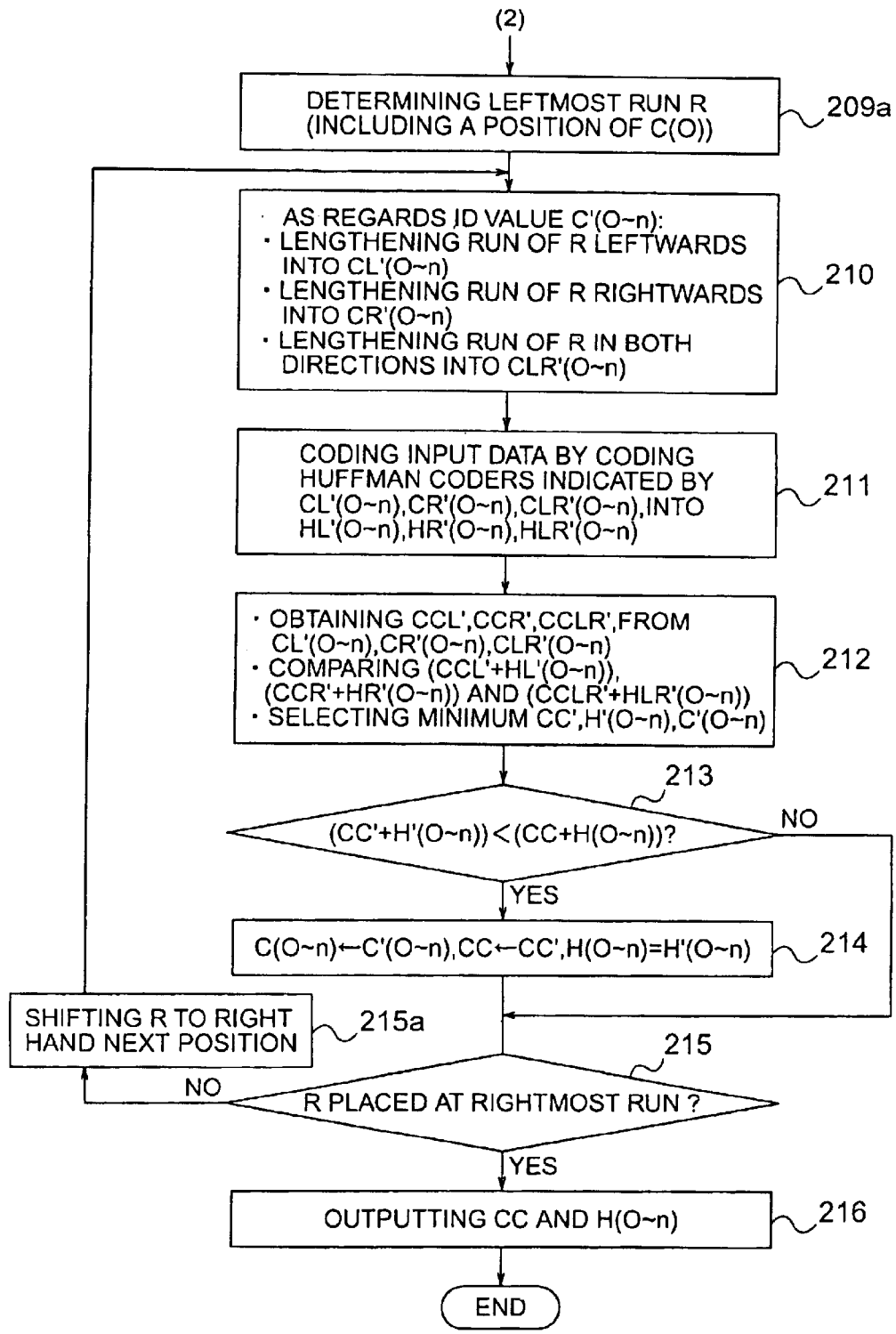
FIG. 7 shows a flow chart for use in describing operation illustrated in FIG. 6 more in detail.

Referring to FIG. 7, the above-mentioned procedure will be described more in detail. Herein, the steps 201 to 209 are omitted from FIG. 7 because they are similar to those illustrated in FIG. 5. In FIG. 7, a step 209a is executed to determine, as a run position R, a variable representative of a run which is being processed. In addition, the ID value C of the run position R is also determined. At the step 209a, decision is made about the leftmost run R which includes the leftmost position of the ID value C(0).

Next, the ID values C(0–n) are changed at a step 210 in three ways or directions. Specifically, an ID value by obtained by lengthening a run of the run position R leftwards is rendered into an ID value CL'(0–n) while an ID value by obtained by lengthening a run of the run position R rightwards is rendered into an ID value CR'(0–n). An ID value obtained by lengthening the run both ways is rendered into CLR'(0–n).

Subsequently, zeroth through n-th data signals are subjected to Huffman coding at a step 211 by using the Huffman coders indicated by the ID values CL'(0–n), CR'(0–n), and CLR'(0–n), to produce Huffman unit codes represented by HL'(0–n), HR'(0–n), and HLR'(0–n).

At a step 212, the ID values CL'(0–n), CR'(0–n), and CLR'(0–n) are coded in a manner similar to that illustrated at the step 209, into ID codes CCL', CCR', and CCLR'. In addition, comparison is made among a combination or total code amount of CCL' and the Huffman unit codes HL'(0–n), a combination or total code amount of CCR' and the Huffman unit codes HR'(0–n), and a combination or total code amount of CCLR' and the Huffman codes HLR'(0–n) to determine a combination of a minimum code amount. In the illustrated example, the minimum code amount is assumed to be realized by the ID code CC', the Huffman codes H'(0–n), and the ID values C'(0–n).

For instance, if the combination of the ID code CCL' and the Huffman codes HL'(0–n) has a minimum code amount, then CC'=CCL', H'(0–n)=HL'(0–n), and C'(0–n)=CL'(0–n).

Thereafter, the step 212 is followed by a step 213 at which comparison is made between the total code amount of CC' and H'(0–n) and the total code amount of CC and H(0–n). If the former is smaller the latter in total code amount (step 213: Yes), a step 214 follows the step 213. Otherwise, the step 213 is succeeded by a step 215. This shows that judgment is made at the step 213 about whether or not a code reduction effect is obtained by changing the ID values at the step 210.

The step 214 is executed to copy the ID values C'(0–n), the ID codes CC', and the Huffman codes H'(0–n) into the ID values C(0–n), the ID codes CC, and the Huffman codes H(0–n), respectively.

At the step 215, it is judged whether or not the run position R is placed at a run including C(n), namely, at the rightmost position. When the run position R is placed at the rightmost position (step 215: Yes), processing proceeds to a step 216 of outputting CC and H(0–n) as processing results, or compressed signals. Otherwise (step 215: No), the run position R is shifted to a right-hand next run at a step 215a. Thereafter, processing is returned back to the step 210.

The above-mentioned operation will be described more in detail by the use of specific numerals. For example, the ID values C(0–4) are assumed to be obtained at the step 209 and to be represented by "0,1,0,1,1".

The ID values are divided into a leftmost run R1 of "0", its right hand next run R2 of "1", its further right hand next run R3 of "0", and the rightmost run R4 of "1,1".

At the step 209a, the run position R is set at R1. Next, the run of the run position R1 is lengthened rightwards at the step 210. As a result, the ID values CR'(0–4) are rendered into "0,0,0,1,1". The run position R1 is places at the leftmost position and its run is therefore lengthened leftwards and in both left and right directions. Similarly, the run position R4 is placed at the rightmost position and its run can not be lengthened rightwards and in both the left and the right directions.

At the step 211, the input data signals are subjected to Huffman coding by using the Huffman coders indicated by the ID values CR'(0–n). Specifically, since the ID value CR'(0) indicates "0" corresponding to the first additional Huffman coder 111 (FIG. 4), as mentioned above, a first one (depicted by D1) of the input data signals is coded by the first additional Huffman coder 111 into Huffman code HR'(0). Likewise, since the ID values CR'(1) and CR'(2) indicates "0", second and third ones (D2 and D3) of the input data signals are also coded by the first additional Huffman coder 111 into Huffman codes HR'(1) and HR'(2). In addition, since the ID value CR'(3) indicates "1", a fourth one (D4) of the input data signals is coded by the second additional Huffman coder 112 into Huffman code HR'(3). Since the ID value CR'(4)="1", a fifth one (D5) of the input data signals is coded by the second additional Huffman coder 112 into Huffman code HR'(4).

Thereafter, the step 212 is executed to code the ID values CR'(0–4) (namely, "0,0,0,1,1") into the ID codes CCR'(0–4). Then, the ID codes CCR'(0–4) are obtained in the form of "0,3,1,2". Inasmuch as the run position R1 is placed at the leftmost position, neither the ID values CL'(0–4) nor CLR'(0–4) exist. Accordingly, no comparison is executed in this case in connection with the total code amounts. As a result, the ID codes CCR'="0,3,1,2", the Huffman codes HR'(0–4), and the ID values CR'(0–4)="0,0,0,1,1" are determined as the ID codes CC', the Huffman codes H'(0–4), and the ID values C'(0–4), respectively.

At the step 213, judgment is made about whether or not the total code amount of the ID codes CC' and the Huffman codes H' are smaller than the total code amount of the ID codes CC and the Huffman codes H. In the illustrated example, it is assumed that the former code amount is smaller than the latter code amount. Under the circumstances, processing proceeds to the step 214 at which the ID codes CC', the Huffman codes H'(0–4), and the ID values C'(0–4) are copied into the ID codes CC, the Huffman codes (0–4), and the ID values C(0–4), respectively.

The step 214 is followed by the step 215 at which the run position R1 is judged about whether or not it is placed at the rightmost position. In the illustrated example, since the run position R1 is not placed at the rightmost position, the step 215 proceeds to the step 215a at which the run position is shifted to the right hand next position R2 and thereafter processing is returned back to the step 210. Thereafter, similar operations or procedures are repeated after the step 210. Taking this into account, description will be made only about the run position R2 but similar description will apply to the run positions R3 and R4.

At the step 210, the run is lengthened at the run position R2 leftwards. In this case, since the original ID values C(0–4) are given by "0,1,0,1,1" the lengthened ID values CL'(0–4) are specified by "1,1,0,1,1". In addition, the run of the run position R2 is lengthened rightwards. Then, the ID values CR'(0–4) are specified by "0,1,1,1,1". Next, when the run of the run position R2 is lengthened in both of left and right directions, the ID values CLR'(0–4) are given by "1,1,1,1,1".

The step 211 is executed to code the input data signals by the use of the additional Huffman coders 111 to 113 indicated by the ID values CL'(0–4). Specifically, since the ID value CL'(0)="1", a first one (D1) of the input data signals is coded by the second additional Huffman coder 112 into Huffman code HL'(0). Likewise, since the ID value CL'(1)="1", a second input data signal D2 is also coded by the second additional Huffman coder 112 into Huffman code HL'(1) while since the ID value CL'(2)="0", a third input data signal is coded by the first additional Huffman coder 111 into Huffman code HL'(2). Furthermore, since the ID value CL'(3)="1" and the ID value CL'(4)="1", fourth and fifth input data signals D4 and D5 are coded by the second additional Huffman coder 112 into Huffman codes HL'(3) and HL'(4), respectively.

Similar operation is executed in connection with the ID values CR'(0–4) Each input data signal is coded by the additional Huffman coder designated by the ID values CR'(0–4). Specifically, since CR'(0)="0", a first input data signal is coded by the first additional Huffman coder 111 into Huffman code HR'(0). Similarly, since the ID values CR'(1)="1", a second input data signal D2 is coded by the second additional Huffman coder 112 into Huffman code HR'(1). Since the ID value CR'(2)="1", a third input data signal D3 is coded by the second additional Huffman coder 112 into Huffman code HR'(2) while since the ID value CR'(3)="1", a fourth input data signal D4 is coded by the second additional Huffman coder 112 into Huffman code HR'(3). Likewise, since the ID value CR'(4)="1", a fifth input data signal D5 is also coded by the second additional Huffman coder 112 into Huffman code HR'(4).

In a similar manner, first through fifth input data signals D1 to D5 are coded by the additional Huffman coders designated by the ID values CLR'(0–4). Specifically, since all of the ID values CLR'(0–4) are "1", as mentioned above, the first through the fifth input data signals D1 to D5 are coded by the second additional Huffman coder 112 into Huffman codes HLR'(0) to HLR'(4), respectively.

Thus, the step 211 is finished and proceeds to the step 212 at which the ID values CL'(0–4), CR'(0–4), and CLR'(0–4) are subjected to run length coding to produce ID codes CCL', CCR', and CCL', respectively. In the above-mentioned example, the ID codes CCL', CCR', and CCLR' are given by "1,2,0,1,1,2", "0,1,1,4", and "1,5", respectively.

Thereafter, the step 212 is succeeded by the step 213 so as to compare the total code amount of CCL' and HR'(0–4), the total code amount of CCR' and HR'(0–4), and the total amount of CLR' and HLR'(0–4) with one another and to determine the ID codes CC', the Huffman codes H'(0–4), and the ID values C'(0–4) of a minimum code amount.

Subsequently, the steps 213 and 214 are executed in the above-mentioned manner and proceed to the step 215 to judge whether or not the run position R2 is placed at the rightmost position. In this case, since the run position R2 is not placed at the rightmost position, the step 215a is executed to shift the run position R2 to a run position R3 placed at a right hand next position and is thereafter returned back to the step 210. Similar operations are executed in connection with the run positions R2 and R3.

Figure 8:
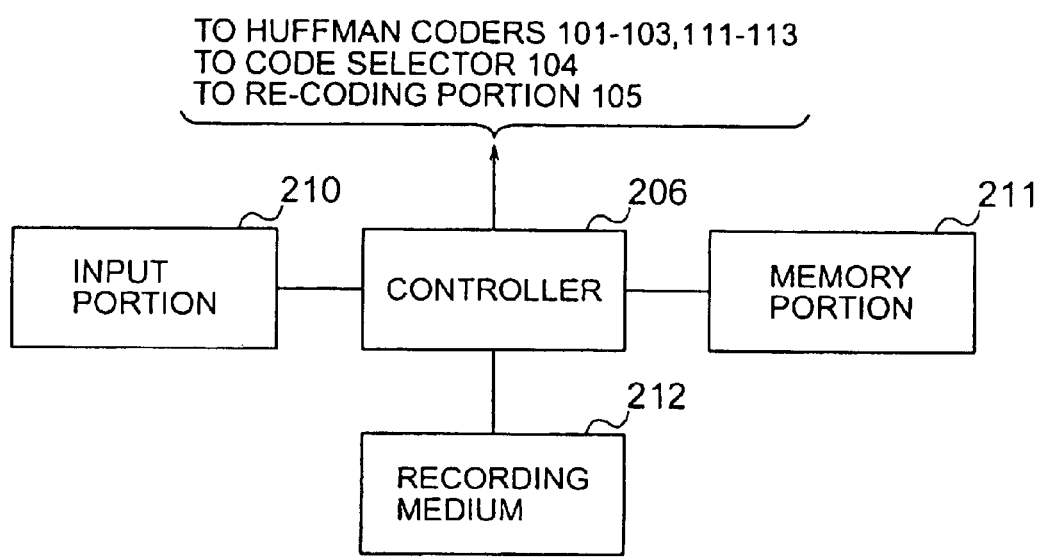
FIG. 8 shows a block diagram of a data compression device according to another embodiment of this invention.

Referring to FIG. 8, a data compression device according to another embodiment of this invention has a recording medium 212 that stores a control program for executing a data compression method mentioned in conjunction with FIGS. 3 to 7. The illustrated device may be specified by the recording medium 212 and a controller 206 which is operable to access the recording medium 212 and to control the Huffman coders 101 to 103, 111 to 113, the code selector 104, and the re-coding portion 105 in a manner similar to the controller 106 illustrated in FIG. 3. Furthermore, the illustrated data compression device has an input portion 210 and a memory portion 211 both of which are controlled by the controller 206.

Herein, it is to be noted that the recording medium 212 stores the control program that is specified by flow charts described with reference to FIGS. 5 to 7.

Now, description will be made about operation of the data compression device illustrated in FIG. 8. At first, a command is issued from the input portion 210 to the controller 206 to read the control program out of the recording medium 212. In this event, the control program is read out of the recording medium 212 and is stored into the memory portion 211 under control of the controller 206. In this situation, when an execution command is given from the input portion 210 to the controller 206 so as to execute the control program, the controller 206 reads the control program out of the memory portion 211 and controls the above-mentioned Huffman coders 101 to 103; 111 to 113, the code selector 104, and the re-coding portion 105 in accordance with the control program.

Such a control operation is similar to that illustrated in FIGS. 5 to 7 and will not be described any longer.

According to this invention, the data compression device makes it possible to reduce a code amount in comparison with the conventional devices by changing identification values so that a total code amount of identification codes and codes dependent on the identification values is decreased. In addition, the total code amount is repeatedly calculated so as to reduce a combination code amount of the identification codes and the Huffman codes. This can accomplish a high data compression at a high compression ratio.

While this invention has thus far been described in conjunction with a few embodiments thereof, it will readily be possible for those skilled in the art to put this invention into practice in various other manners.

What is claimed is:

1. A data compression device comprising:
   a plurality of coding means for successively coding a sequence of data signals by using a plurality of coding units that are given identification values, respectively, and that are different in structure from one another to produce a plurality of codes in response to each input data signal;
   selecting means for selecting a shortest one of the codes to produce a sequence of the shortest codes and the corresponding identification codes obtained by coding a sequence of the identification values assigned to the coding units of producing the shortest codes; and
   re-coding means for re-coding the input data sequence into re-coded codes, by changing the identification values into changed identification values so as to reduce a total code amount of identification codes obtained by the changed identification values and the re-coded codes coded in accordance with the changed identification values and to produce the re-coded codes and the changed identification codes as a compressed output data sequence.

2. A data compression device as claimed in claim 1, wherein the re-coding means changes the sequence of the identification values to the changed identification values, so as to decrease the code amount of the identification codes.

3. A data compression device as claimed in claim 1, wherein the sequence of the identification values is subjected to run length coding to obtain the identification codes.

4. A data compression device as claimed in claim 1, wherein the re-coding means comprises:
   calculating means for calculating a first total code amount of the re-coded codes and the corresponding changed identification codes and a second total code amount of the shortest codes and the corresponding identification codes; and
   comparing means for comparing the first total code amount with the second total code amount to produce the re-coded codes and the changed identification codes as the compressed output data sequence when the first total code amount is smaller than the second total code amount.

5. A data compression device as claimed in claim 4, wherein the re-coding means comprises:
   changing means for further changing the sequence of the identification values so that the changed identification codes have a smaller amount to repeatedly operate the comparing means.

6. A data compression device as claimed in claim 3, wherein run length coding is carried out so that each run of the identification values becomes long and thereby a code amount of the identification values is controlled.

7. A data compression device as claimed in claim 3, wherein the re-coding means comprises:
   means for changing the sequence of the identification values divided into a plurality of runs, into the changed identification values by lengthening each run of the identification values; and
   a plurality of coding means for coding the input data signals in accordance with the changed identification values.

8. A data compression device as claimed in claim 7, wherein the plurality of the coding means are selected by each of the changed identification values.

9. A data compression device as claimed in claim 1, wherein the plurality of the coding means are Huffman coders that have different coding tables.

10. A data compression device as claimed in claim 9, wherein the re-coding means comprises:
a plurality of additional Huffman coders that have different coding tables and that are made to correspond to the Huffman coders, respectively.

11. A data compression method comprising the steps of:
coding a sequence of input data signals into a plurality of code sequences obtained by the use of different coding methods given identification values, respectively;
selecting a shortest one of the code sequences together with a selected sequence of the identification values concerned with each code of the shortest code sequence;
coding the selected identification value sequence into a sequence of identification codes;
changing the selected identification value sequence into a changed sequence of identification values; and
re-coding the input data signals by the use of the changed sequence of the identification values to obtain re-coded codes and the corresponding changed identification codes and to produce the re-coded codes and the corresponding changed identification codes as a data compressed output signal sequence.

12. A data compression method as claimed in claim 11, wherein the changing step is executed so that a code amount of identification codes obtained by the changed sequence of the identification values becomes small in comparison with a code amount of the selected identification value sequence.

13. A data compression method as claimed in claim 11, wherein the re-coding step comprises the steps of:
calculating a first total code amount of the re-coded codes and the corresponding changed identification codes and a second total code amount of the shortest codes and the corresponding identification codes; and
comparing the first total code amount with the second total code amount to produce the re-coded codes and the changed identification codes as the compressed output data sequence when the first total code amount is smaller than the second total code amount.

14. A data compression method as claimed in claim 13, wherein the re-coding step comprises the step of:
further changing the sequence of the identification values so that the changed identification codes have a smaller amount to repeatedly operate the comparing step.

15. A data compression method as claimed in claim 13, wherein the run length coding is carried out so that each run of the identification values becomes long and thereby a code amount of the identification values is controlled.

16. A recording medium which stores a control program and which is readable by a computer, the control program comprising the steps of:
coding a sequence of input data signals into a plurality of code sequences obtained by the use of different coding methods given identification values, respectively;
selecting a shortest one of the code sequences together with a selected sequence of the identification values concerned with each code of the shortest code sequence;
coding the selected identification value sequence into a sequence of identification codes;
changing the selected identification value sequence into a changed sequence of identification values; and
re-coding the input data signals by the use of the changed sequence of the identification values to obtain re-coded codes of the input data signals and the corresponding changed identification codes and to produce the re-coded codes and the corresponding changed identification codes as a data compressed output signal sequence.

17. A recording medium as claimed in claim 16, wherein the changing step is executed so that a code amount of identification codes obtained by the changed sequence of the identification values becomes small in comparison with a code amount of the selected identification value sequence.

18. A recording medium as claimed in claim 16, wherein the re-coding step comprises the steps of:
calculating a first total code amount of the re-coded codes and the corresponding changed identification codes and a second total code amount of the shortest codes and the corresponding identification codes; and
comparing the first total code amount with the second total code amount to produce the re-coded codes and the changed identification codes as the compressed output data sequence when the first total code amount is smaller than the second total code amount.

19. A recording medium as claimed in claim 18, wherein the re-coding step comprises the step of:
further changing the sequence of the identification values so that the changed identification codes have a smaller amount to repeatedly operate the comparing means.

20. A recording medium as claimed in claim 18, wherein run length coding is carried out to calculate each code amount of the changed identification codes so that each run of the identification values becomes long.

21. A recording medium as claimed in claim 18, wherein the identification values are changed to changed identification values so that each run of the identification values becomes long and the re-coding step is carried out by the use of the changed identification values.

22. A data compression device operable in response to a sequence of input data signals to produce a sequence of output compressed data signals, the data compression device comprising:
a plurality of data coding means which are given identification values, respectively, and which carry out coding of the input data signals in different ways, respectively, for coding the input data signal sequence into a plurality of codes with the respective identification values attached, respectively;
selecting means for selecting a minimum code amount of the codes as selected codes with selected identification values which are attached and which are coded into selected identification codes;
changing means for changing the identification values into changed identification values which are coded into changed identification codes;
re-coding means for re-coding the input data signals into a sequence of re-coded signals with reference to the changed identification values so as to compare a total code amount of the selected codes and the selected identification codes with a total code amount the re-coded codes and the changed identification codes;
the selected identification codes being produced by run length coding a sequence of the identification values while the changing means changes the identification values into the changed identification values by lengthening each run of the identification value sequence so that each run becomes long;

the re-coding means re-coding the input data signals in accordance with the changed identification codes.

23. A data compression device as claimed in claim 22, wherein each of the selected and the changed identification values is divided into a plurality of runs arranged from a leftmost run to a rightmost one;

the changing means successively lengthening each run from the leftmost run to the rightmost run.

24. A data compression method of executing data compression in response to a sequence of input data signals to produce a sequence of output compressed data signals, the data compression method comprising the steps of:

carrying out coding of the input data signals into a plurality of codes with respective identification codes attached by using a plurality of data coding means which are given the identification values, respectively;

selecting a minimum code amount of the codes as selected codes with selected identification values which are attached and which are coded into selected identification codes;

changing the identification values into changed identification values which are coded into changed identification codes;

re-coding the input data signals into a sequence of re-coded signals with reference to the changed identification values so as to compare a total code amount of the selected codes and the selected identification codes with a total code amount the re-coded codes and the changed identification codes;

the selected identification codes being produced by run length coding a sequence of the identification values while the changing means changes the identification values into the changed identification values by lengthening each run of the identification value sequence so that each run becomes long;

the re-coding step re-coding the input data signals in accordance with the changed identification codes.

25. A data compression method as claimed in claim 24, wherein each of the selected and the changed identification values is divided into a plurality of runs arranged from a leftmost run to a rightmost one;

the changing means successively lengthening each run from the leftmost run to the rightmost run.

26. A program for use in carrying out data compression of a sequence of input data signals to produce a compressed output data sequence, the program comprising the steps of:

carrying out coding of the input data signals into a plurality of codes with respective identification codes attached by using a plurality of different data coding means which are given the identification values, respectively;

selecting a minimum code amount of the codes as selected codes with selected identification values which are attached and which are coded into selected identification codes;

changing the identification values into changed identification values which are coded into changed identification codes;

re-coding the input data signals into a sequence of re-coded signals with reference to the changed identification values so as to compare a total code amount of the selected codes and the selected identification codes with a total code amount the re-coded codes and the changed identification codes;

the selected identification codes being produced by run length coding a sequence of the identification values while the changing means changes the identification values into the changed identification values by lengthening each run of the identification value sequence so that each run becomes long;

the re-coding step re-coding the input data signals in accordance with the changed identification codes.

27. A program as claimed in claim 26, wherein each of the selected and the changed identification values is divided into a plurality of runs arranged from a leftmost run to a rightmost one;

the changing means successively lengthening each run from the leftmost run to the rightmost run.

28. A program as claimed in claim 26, wherein the plurality of the different data coding means are Huffman coders which have coding tables different from one another.

* * * * *